(12) United States Patent
Mariani et al.

(10) Patent No.: US 10,522,478 B2
(45) Date of Patent: Dec. 31, 2019

(54) SEMICONDUCTOR DEVICE WITH CIRCUMFERENTIAL STRUCTURE AND METHOD OF MANUFACTURING

(71) Applicant: Infineon Technologies AG, Neubiberg (DE)

(72) Inventors: Franco Mariani, Pentling-Neudorf (DE); Adolf Koller, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/872,322

(22) Filed: Jan. 16, 2018

(65) Prior Publication Data
US 2018/0204808 A1    Jul. 19, 2018

(30) Foreign Application Priority Data
Jan. 17, 2017 (DE) .................. 10 2017 100 827

(51) Int. Cl.
| | | |
|---|---|---|
| H01L 21/268 | (2006.01) |
| H01L 21/78 | (2006.01) |
| H01L 29/04 | (2006.01) |
| H01L 23/00 | (2006.01) |
| H01L 23/58 | (2006.01) |
| H01L 21/304 | (2006.01) |

(52) U.S. Cl.
CPC .......... H01L 23/562 (2013.01); H01L 21/268 (2013.01); H01L 21/78 (2013.01); H01L 23/585 (2013.01); H01L 29/04 (2013.01); H01L 21/304 (2013.01); H01L 21/7806 (2013.01)

(58) Field of Classification Search
CPC ..... H01L 3/562; H01L 21/268; H01L 23/485; H01L 21/78; H01L 29/04; H01L 23/562
USPC .......................... 438/462, 464; 257/757, 797
See application file for complete search history.

(56) References Cited

U.S. PATENT DOCUMENTS

| | | |
|---|---|---|
| 2005/0035100 A1 | 2/2005 | Genda |
| 2014/0179083 A1 | 6/2014 | Buenning et al. |
| 2016/9971770 * | 3/2016 | Albermann ......... H01L 21/7806 257/757 |
| 2016/0158880 A1 | 6/2016 | Koitzsch et al. |

* cited by examiner

*Primary Examiner* — Thinh T Nguyen
(74) *Attorney, Agent, or Firm* — Murphy, Bilak & Homiller, PLLC

(57) ABSTRACT

A circumferential embedded structure is formed by laser irradiation in a semiconductor substrate, which is of a semiconductor material. The embedded structure includes a polycrystalline structure of the semiconductor material, and surrounds a central portion of a semiconductor die. The semiconductor die including the embedded structure is separated from the semiconductor substrate.

20 Claims, 14 Drawing Sheets

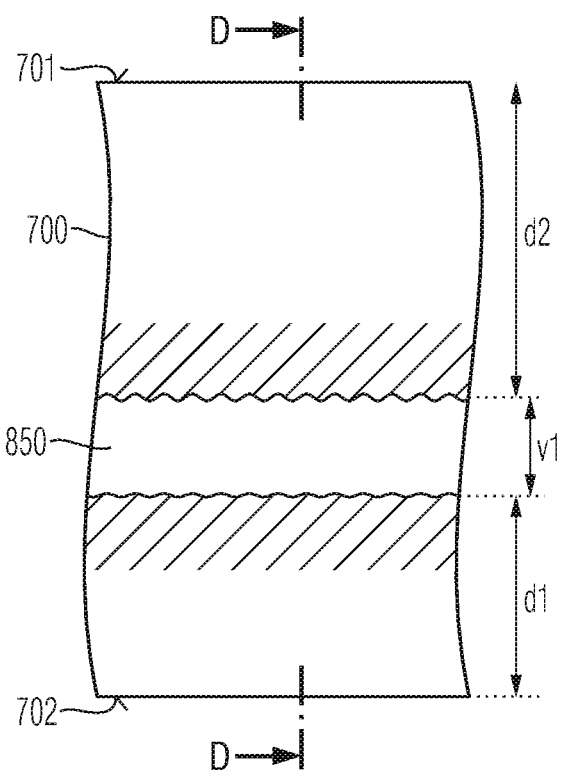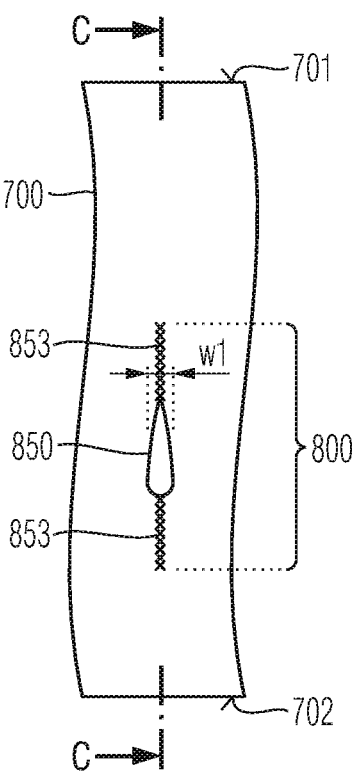

SEMICONDUCTOR DEVICE WITH CIRCUMFERENTIAL STRUCTURE AND METHOD OF MANUFACTURING

BACKGROUND

Electrical elements of integrated circuits are formed in a series of processes applied to a semiconductor wafer. After completion of wafer level manufacturing the semiconductor wafer is separated into individual semiconductor dies. Die separation, also called "dicing", may include attaching a carrier substrate at one side of the semiconductor wafer. The carrier substrate holds the wafer in place during dicing, which may include scribing, sawing, and/or etching, by way of example. Conventional laser dicing methods use laser light at a wavelength that is absorbed by the semiconductor material of the semiconductor wafer. Stealth dicing uses laser light with a wavelength at which the semiconductor substrate is highly transparent such that the laser beam can be focused inside the semiconductor wafer. Around the focal point the laser beam melts the semiconductor material, which recrystallizes in polycrystalline form with high density dislocations that result in significant mechanical stress. The mechanical stress effects that perpendicular cracks can develop towards the wafer front and back surfaces. In this way the stress induced by local transformation of the single-crystal semiconductor material into polycrystalline semiconductor material facilitates die separation by applying an external force in a suitable way.

Mechanical dicing is easy to implement and allows high throughput but tends to generate cracks that may propagate into the semiconductor devices. The cracks are hardly to detect but may have significant impact on device reliability. There is a need for a method for die separation with improved trade-off between cost and device reliability.

SUMMARY

The present disclosure concerns a method of manufacturing semiconductor devices. The method includes forming, by laser irradiation, a circumferential embedded structure in a semiconductor substrate of a semiconductor material. The embedded structure includes a polycrystalline structure of the semiconductor material and surrounds a central portion of a semiconductor die. The semiconductor die is separated from the semiconductor substrate, wherein the semiconductor die includes the embedded structure.

The present disclosure further refers to a semiconductor device that includes functional elements in an active region of a single crystalline semiconductor body of a semiconductor material. The semiconductor device further includes a circumferential embedded structure including a polycrystalline structure of the semiconductor material in the semiconductor body. The embedded structure surrounds at least a central portion of the active region.

Further embodiments are described in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments and together with the description serve to explain principles of the embodiments. Further embodiments and intended advantages will be readily appreciated as they become better understood by reference to the following detailed description.

FIG. 7C is a vertical cross-sectional view of a portion of a semiconductor substrate in a plane parallel to a horizontal longitudinal extension of an embedded structure comprising a continuous polycrystalline structure according to another embodiment.

FIG. 7D is a vertical cross-sectional view of the semiconductor substrate portion of FIG. 7C in a plane perpendicular to the horizontal longitudinal extension of the embedded structure.

DETAILED DESCRIPTION

In the following detailed description, reference is made to the accompanying drawings, which form a part hereof and in which are shown by way of illustrations specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or heavily doped semiconductor material. The term "electrically coupled" includes that one or more intervening element(s) adapted for signal transmission may be between the electrically coupled elements, for example, elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
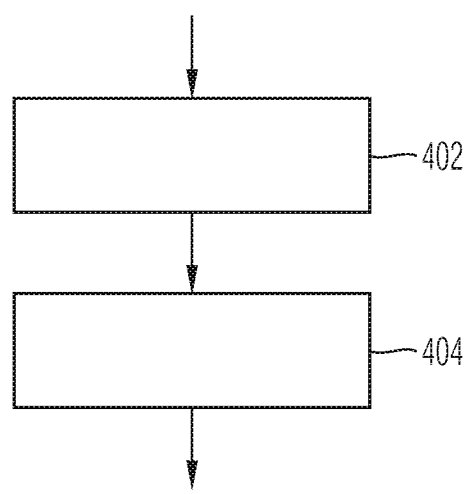
FIG. 1 is a simplified flowchart of a method of manufacturing semiconductor devices that includes forming a circumferential embedded structure by laser irradiation, according to an embodiment.

FIG. 1 concerns a method that uses laser radiation of a wavelength, at which a concerned semiconductor substrate is highly transparent, to form embedded structures which may be effective as crack-stop during a mechanical dicing and/or as regions with increased density of gettering sites for impurity atoms and/or recombination centers for mobile charge carriers. The method includes forming a circumferential embedded structure (402) in the semiconductor substrate by laser irradiation, wherein the embedded structure includes a polycrystalline structure of a semiconductor material of the semiconductor substrate and surrounds a central portion of a semiconductor die.

The semiconductor material of the semiconductor substrate may be, e.g., silicon (Si), germanium (Ge), silicon germanium (SiGe), silicon carbide (SiC) or an $A_{III}B_V$ semiconductor. The semiconductor substrate may form a homogeneous substrate of one single semiconductor material, e.g., a silicon wafer, or may form a substrate layer on a substrate base of a further semiconductor material or of an insulator material.

The semiconductor substrate includes a plurality of regularly arranged device regions of semiconductor dies, wherein the device regions are separated by orthogonal kerf streets, which form a grid-shaped kerf region. Each device region includes a central active region and may include a peripheral termination region surrounding the active region and separating the active region from the kerf streets.

Each device region is assigned to an individual semiconductor die, wherein at wafer level processing the semiconductor substrate forms a composite of a plurality of the semiconductor dies.

The laser wavelength is selected such that the crystal is locally damaged in the focus region of the laser beam but remains nearly undamaged between the surface and the focus region. For example, the laser wavelength is selected such that a transmittance of the semiconductor material at the laser wavelength is at least 50%, e.g. at least 80%. The laser beam is directed to one of the base surfaces of the semiconductor substrate, e.g., the rear side surface of the semiconductor substrate and is focused in the semiconductor substrate at a focal distance of at least 20 μm to the base surface. The laser irradiation may be pulsed, wherein duration and energy of the laser pulses are selected such that in a region around the focal point the single-crystalline semiconductor material transforms into a polycrystalline structure.

A suitable relative movement between the semiconductor substrate and the laser beam forms embedded structures that include polycrystalline structures and that surround at least central portions of the semiconductor dies.

A volumetric expansion that accompanies the localized polycrystallisation generates significant local compressive stress. Significant tensile stress is effective in portions of the single crystalline semiconductor substrate in the vertical projection of the polycrystalline structures both in the direction of the main surface and in direction of the rear side surface. The tensile-stressed portions may include crystal defects, e.g., dislocations, planar defects of crystal surfaces and/or micro-cracks mainly propagating along the vertical projection.

The polycrystalline structure and tensile-stressed portions of the semiconductor substrate close to and in the vertical direction of the polycrystalline structure complement each other to a circumferential embedded structure surrounding at least a central portion of the semiconductor die, the complete active region or the complete device region.

The method further includes, after formation of the circumferential embedded structure, separating the individual semiconductor dies from the semiconductor substrate (404), wherein each semiconductor die typically includes the complete embedded structure.

During die separation, the embedded structure is effective as crack-stop structure that suppresses propagation of cracks originating at a side surface exposed during the separation process into the single-crystalline central portion surrounded by the embedded structure.

For example, mechanical stress applied by a dicing saw may result in cracks propagating from a dicing trench formed by the dicing saw into direction of the central portion of the semiconductor die. The embedded crack-stop structure at a suitable distance to the main surface and/or to the rear side surface as well as to the side surface exposed by the dicing trench effectively suppresses propagation of the cracks into the central portion of the semiconductor die, which includes the majority of the functional elements. The embedded crack-stop can be applied on demand for existing layouts. The embedded crack-stop structure does not reduce area efficiency, because no chip area has to be reserved for the crack-stop structure at the front side. An effective crack-stop structure further allows for increasing the progressive feed of a dicing saw.

After die separation the grain boundaries and crystal defects of the embedded structure may be effective as gettering sites for impurity atoms. For power semiconductor devices the grain boundaries and crystal defects of the embedded structure may also be effective as recombination centers reducing charge carrier lifetime selectively in the termination region.

According to an embodiment, the method may further include, before die separation, forming functional elements of the semiconductor device in the active regions of the semiconductor substrate. The functional elements may be formed before formation of the embedded structure.

All functional elements, which define the functionality of the finalized semiconductor device, are formed in the active region of an individual device region. The functional elements may include active electronic elements with a non-linear characteristic such as pn diodes, Schottky diodes, bipolar transistors, field effect transistors, and memory cells and/or passive electronic elements such as resistors and capacitors as well as micro-electromechanical structures.

The functional elements may be formed mainly by front side processing including lithographic processes, etch processes, implantation processes and deposition processes performed at the front side. Forming functional elements may also include a number of process steps applied on or through a rear side surface opposite to the main surface, for example, one or more implants of dopants and activation of implanted dopants by a laser anneal.

FIGS. 2A to 4B show formation of functional elements 190 and formation of a circumferential embedded structures 800 in a single-crystalline semiconductor substrate 700 according to the method described with reference to FIG. 1.

A semiconductor material of the semiconductor substrate 700 may be, e.g., Si, Ge, SiGe, SiC or an $A_{III}B_V$ semiconductor. The semiconductor substrate 700 may be a flat cylindrical semiconductor slice obtained by sawing a crystal ingot, e.g., a silicon wafer with a diameter of 100 mm, 150 mm, 200 mm, 300 mm or more and a thickness measured between a main surface 701 and an opposite rear side surface 702 greater than 100 µm, e.g., greater than 750 µm. The semiconductor substrate 700 may be highly-resistive, n-type or p-type.

The normal to the main surface 701 defines a vertical direction and directions parallel to the main surface 701 are horizontal directions.

Figure 2A:
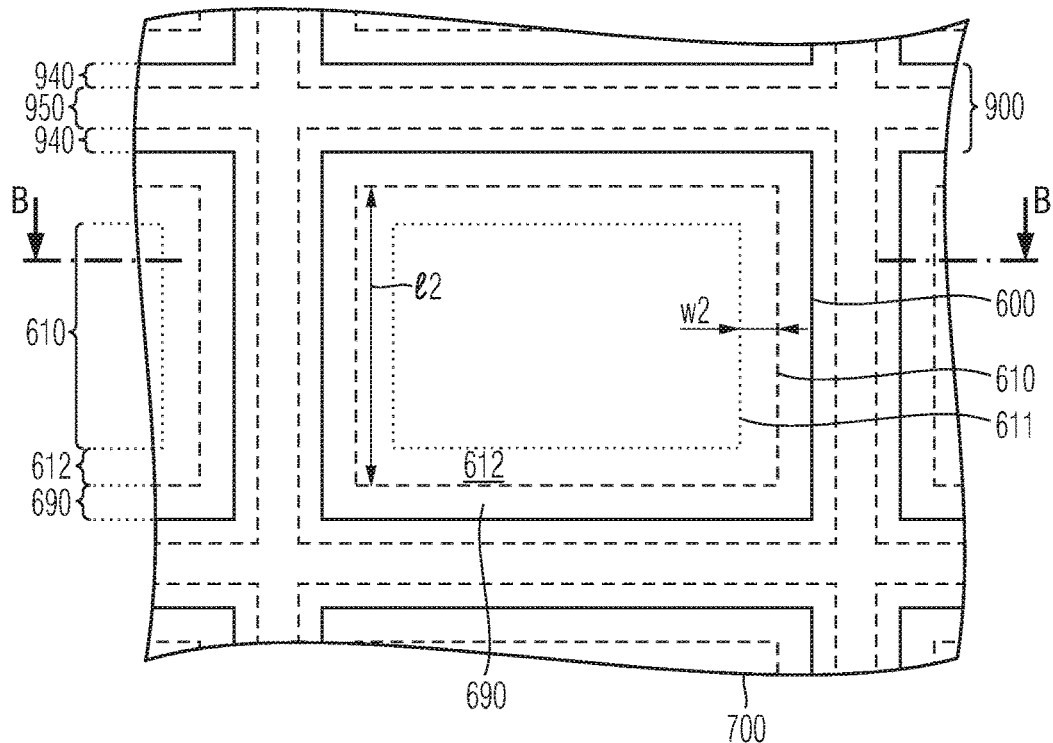
FIG. 2A is a schematic horizontal cross-sectional view of a portion of a semiconductor substrate for illustrating a method of manufacturing semiconductor devices according to an embodiment, after forming functional elements in an active region.

As shown in FIG. 2A, the semiconductor substrate 700 includes a plurality of regularly spaced device regions 600 arranged in lines and rows. A horizontal cross-sectional area of a device region 600 may be a rectangle with an edge length in a range from 100 µm to several millimeters. Each device region 600 includes a central active region 610 and may include a peripheral termination region 690 surrounding the active region 610 at approximately uniform width.

The active region 610 includes a central portion 611 and a peripheral portion 612 surrounding the central portion 611 at approximately uniform width. A width w2 of the peripheral portion 612 may be at most 5%, e.g., at most 2% of the smaller edge length 12 of the active region 610, by way of example.

In the active region 610 all functional elements 190 are formed that define the target functionality of the finalized semiconductor device. For example, in case the finalized semiconductor device is a controller, all functional elements 190 contributing to the functionality of the controller are formed in the active region 610. In case the semiconductor device embodies a logic device, all logic circuits are formed within the active region. In a power semiconductor device including a plurality of transistor cells electrically connected in parallel, all functional transistor cells are formed within the active region and in case of a power semiconductor device including logic circuits, both the logic circuits and all functional transistor cells are formed within the active region. In case of a power semiconductor diode, at least one of the anode region and the cathode region is exclusively formed within the active region.

The functional elements 190 may include active electronic elements such as pn diodes, Schottky diodes, bipolar transistors, field effect transistors, memory cells and passive electronic elements such as resistors and capacitors as well as micro-electromechanical structures.

The termination region 690 is devoid of functional elements 190 and may include an edge construction 695 aiming at protecting the functional elements 190 in the active region 610 against external influences or at decoupling the functional elements 190 from effects occurring at the edge of a semiconductor die that includes the device region 600. The edge construction 695 may include a guard ring, a seal ring and/or a circumferential trench filled with a dielectric material, by way of example.

Figure 2B:
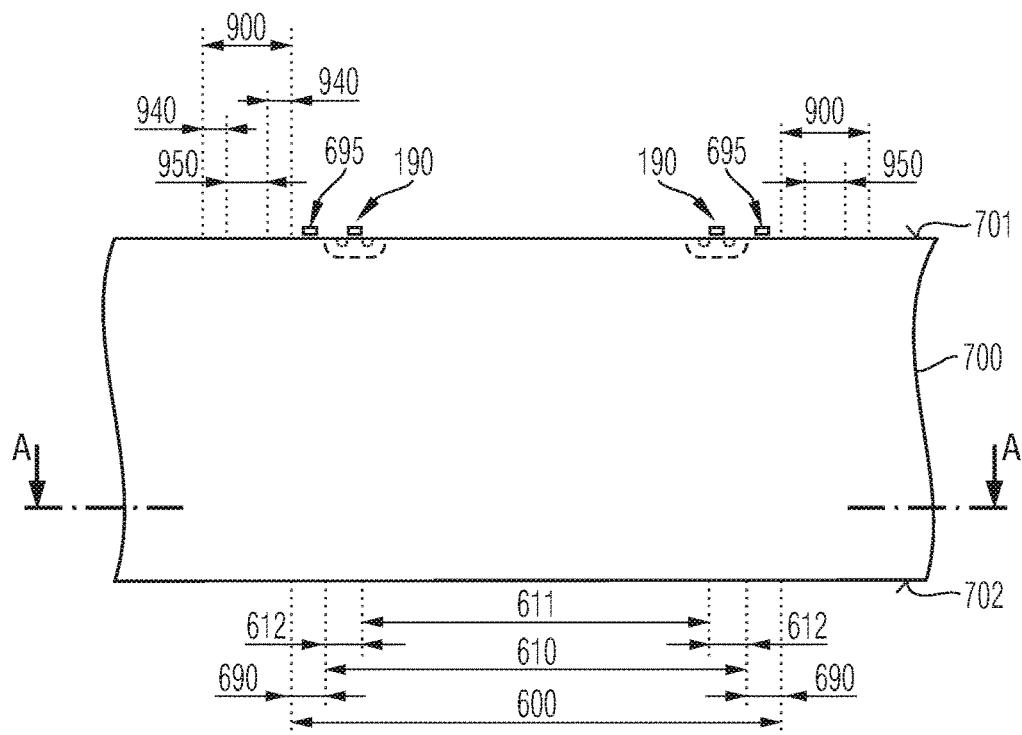
FIG. 2B is a schematic vertical cross-sectional view of the semiconductor substrate portion of FIG. 2A along line B-B.

A grid-shaped kerf region 900 includes orthogonal kerf streets that separate neighboring device regions 600. The kerf region 900 includes a central target dicing area 950 which is consumed by a perfectly adjusted dicing process and a safety margin area 940 between the target dicing area 950 and the device regions 600, wherein a width of the safety margin area 940 is equal to or greater than a maximum tolerable lateral deviation of the dicing process. FIG. 2B shows the semiconductor substrate portion of FIG. 2A along line B-B.

Figure 3A:
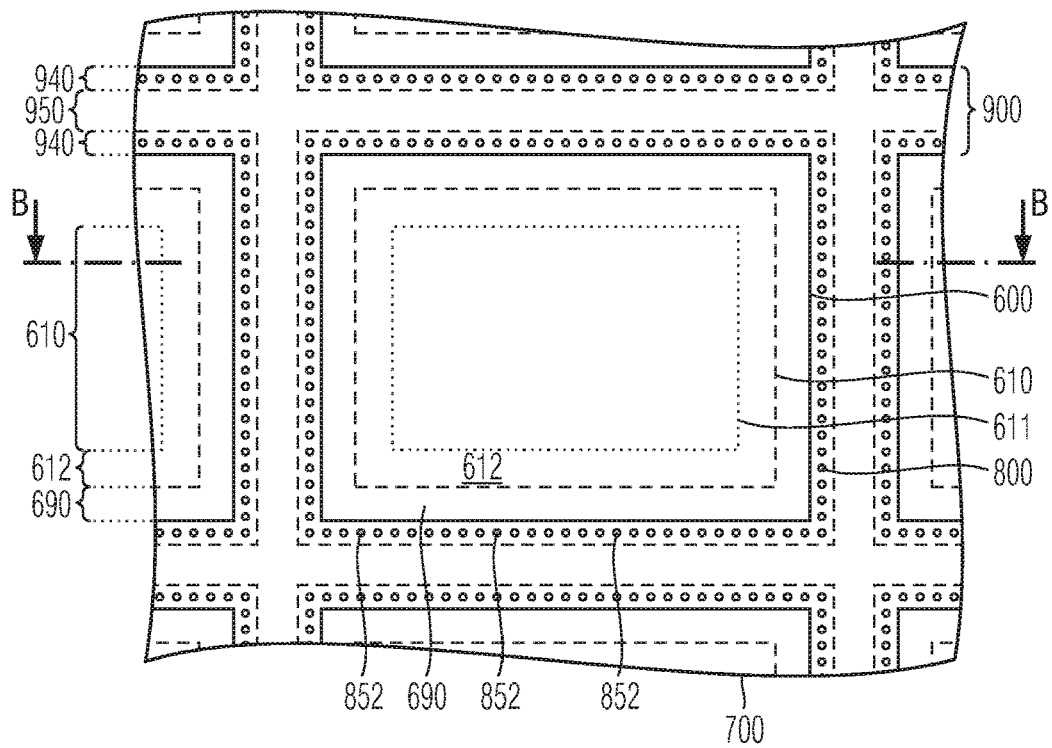
FIG. 3A is a schematic horizontal cross-sectional view of the semiconductor substrate portion of FIG. 2A, after forming a circumferential embedded structure.
Figure 3B:
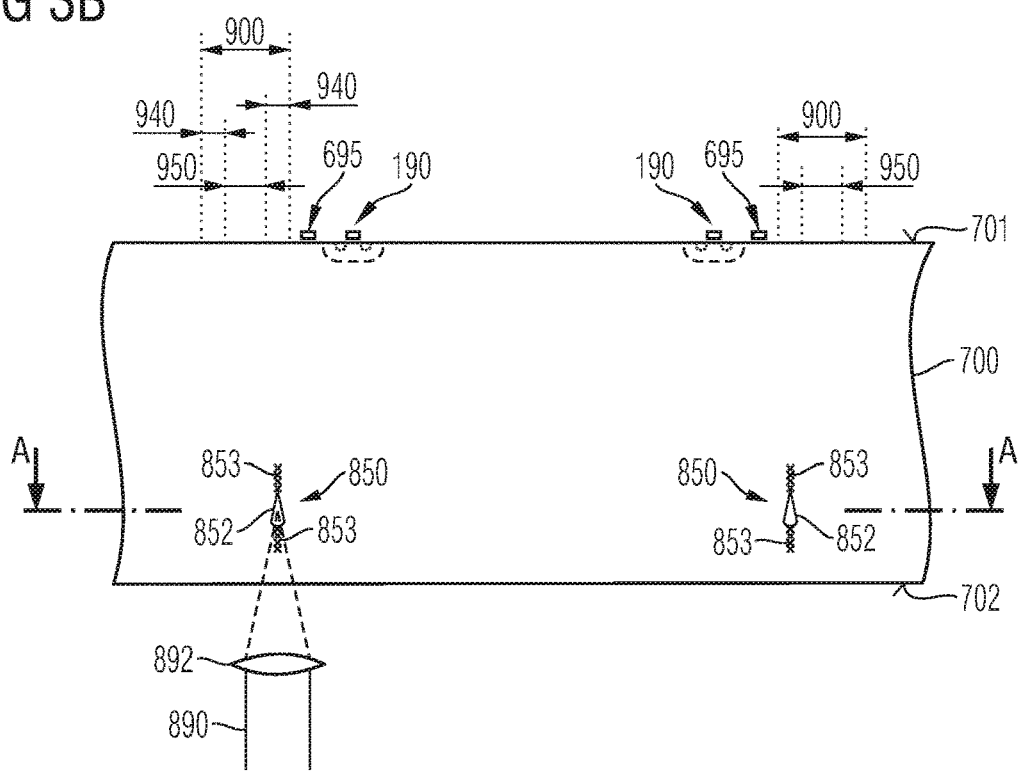
FIG. 3B is a schematic vertical cross-sectional view of the semiconductor substrate portion of FIG. 3A along line B-B.

FIGS. 3A and 3B concern the formation of a circumferential embedded structure 800 by laser irradiation.

FIG. 3B shows a laser beam 890 directed onto an accessible base surface of the semiconductor substrate 700. In case the embedded structure 800 is formed after such structures that are less transparent or nearly opaque for the laser beam 890, e.g., metal pads or metal connection lines, have been formed at the front side, the laser beam 890 is directed to the rear side surface 702. In case the embedded structure 800 is formed before opaque structures are formed at the front side or in case at least the kerf region 900 remains accessible for the laser beam 890 after finalizing front side processing, the laser beam 890 may be directed to the main surface 701.

A laser wavelength of the laser beam 890 is selected such that a transmittance of the semiconductor material is at least 50%, at least 80%, e.g., greater than 90%. An optical system 892 focuses the laser beam 890 in the semiconductor substrate 700 at a focal distance of at least 20 µm, e.g., at least 30 µm to the rear side surface 702.

For example, for a semiconductor substrate of silicon, the laser wavelength may be at least 1000 nm, for example, 1064 nm, a pulse duration may be in a range from 10 ns to 500 ns, e.g., 100 ns to 200 ns and a pulse energy may be in a range from 2.0 pJ to 20 pJ, e.g., from 4 pJ to 5 pJ.

The laser beam 890 may locally melt the single crystalline semiconductor material that recrystallizes in polycrystalline form. A suitable relative movement between the semiconductor substrate 700 and the laser beam 890 forms circumferential embedded structures 800 that include polycrystalline structures 850 and that surround at least the central portions 611 of the active regions 610.

The polycrystalline structures 850 may form continuous polycrystalline ribbons or continuous rows of separated polycrystalline columns 852, wherein the continuous ribbons or the continuous rows extend across the complete usable area of the semiconductor substrate 700 and cross the kerf streets between the device regions 600 and wherein sections of two orthogonal pairs of neighboring ribbons or rows form an individual circumferential embedded structure 800 for an individual device region 600.

According to the embodiment illustrated in FIG. 3A, laser irradiation is suppressed in at least portions of the kerf streets such that the laser irradiation forms a plurality of separated circumferential embedded structures 800. Each embedded structure 800 may include four straight rows of separated, e.g., equally spaced polycrystalline columns 852, wherein the four rows of separated polycrystalline columns 852 form a crack-stop frame around at least a central portion 611 of the active region 610. In the illustrated embodiment, the crack-stop frames are formed in the kerf region 900 and surround individual device regions 600.

A volumetric expansion that accompanies the localized polycrystallisation generates significant local compressive stress. Significant tensile stress is effective in tensile-stressed portions 853 of the single-crystalline semiconductor substrate 700 in the vertical projection of the polycrystalline structure 850 both in the direction of the main surface 701 and in direction of the rear side surface 702. The tensile-stressed portions 853 may include planar crystal defects, e.g., offset crystal surfaces and/or micro-cracks mainly propagating along the vertical projection.

The polycrystalline structure 850 and tensile-stressed portions 853 of the semiconductor substrate 700 close to and in the vertical direction of the polycrystalline structure 850 are portions of the circumferential embedded structure 800 surrounding the central portion 611 of the active region 610, or the complete active region 610, or the complete device region 600.

Figure 4A:
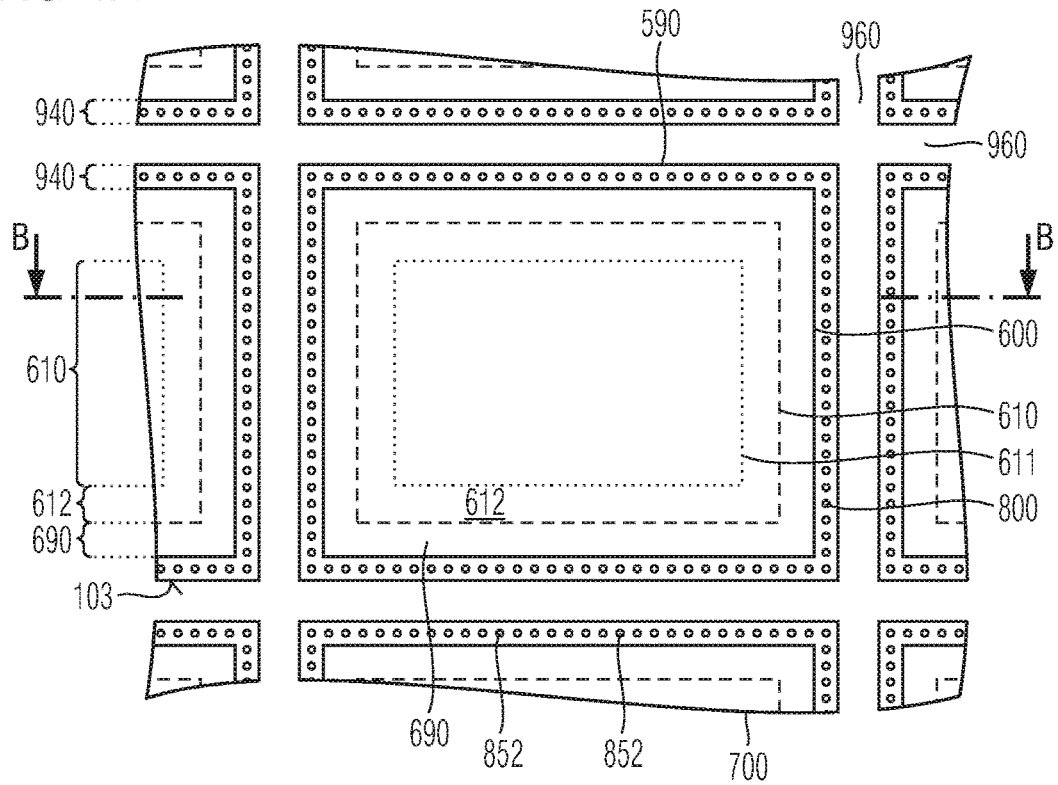
FIG. 4A is a schematic horizontal cross-sectional view of the portion of the semiconductor substrate portion of FIG. 3A, after die separation.
Figure 4B:
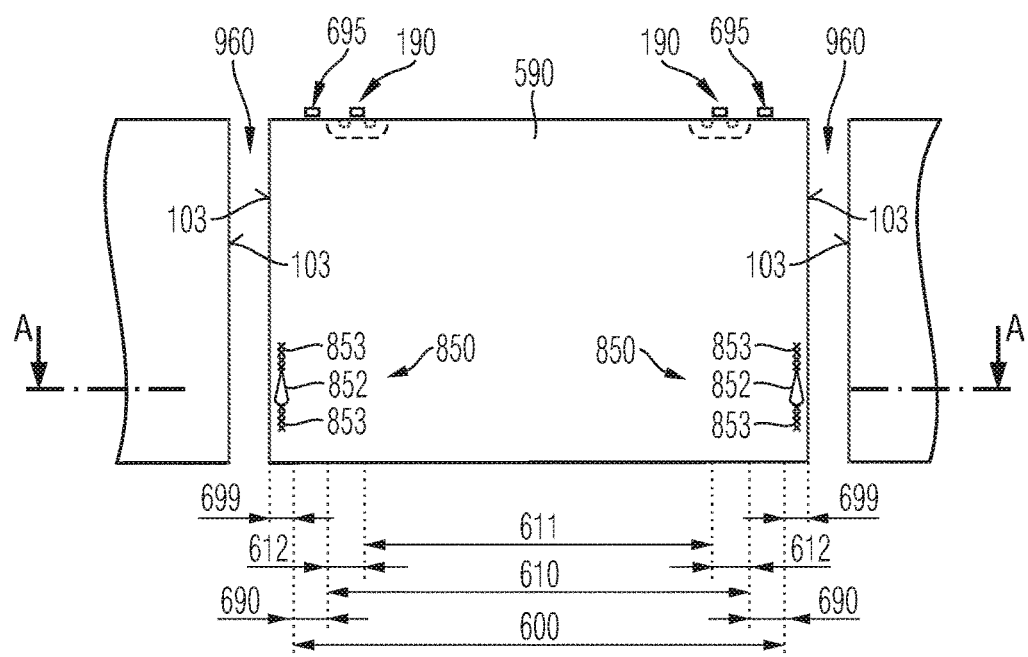
FIG. 4B is a schematic vertical cross-sectional view of the semiconductor substrate portion of FIG. 4A along line B-B.

FIGS. 4A and 4B show the separation of semiconductor dies 590 from the semiconductor substrate 700 after formation of the functional elements 190 and after formation of the circumferential embedded structure 800, wherein each semiconductor die 590 includes at least an individual device region 600.

Die separation may include attaching a carrier substrate, for example, a pick-up tape or a plate at the front side of the semiconductor substrate 700 and forming dicing trenches 960 along the kerf streets, wherein the dicing trenches 960 extend through the semiconductor substrate 700.

A semiconductor die 590 obtained by the separation process includes at least an individual device region 600 and may further include an idle region 699 originating from a remnant portion of the kerf region 900 between the device region 600 and the actual dicing trench 960.

The dicing exposes a side surface 103 of the semiconductor die 590 and the embedded structure 800 is effective as crack-stop structure that prevents cracks, which originate at the side surface 103, from propagating into the single-crystalline portion surrounded by the embedded structure 800.

Mechanical stress applied by a dicing saw may result in cracks propagating from the dicing trench 960 into direction of the active region 610. An embedded crack-stop structure at a suitable distance to the main surface 701 and/or to the rear side surface 702 as well as to the dicing trench 960 effectively suppresses propagation of the cracks into the active region 610. An effective crack-stop structure further allows for increasing the progressive feed of a dicing saw.

After die separation grain boundaries and crystal defects of the embedded structure 800 may be effective as gettering sites for impurity atoms. For power semiconductor devices the grain boundaries and crystal defects of the embedded structure 800 may be effective as recombination centers reducing charge carrier lifetime selectively in the termination region.

Figure 5A:
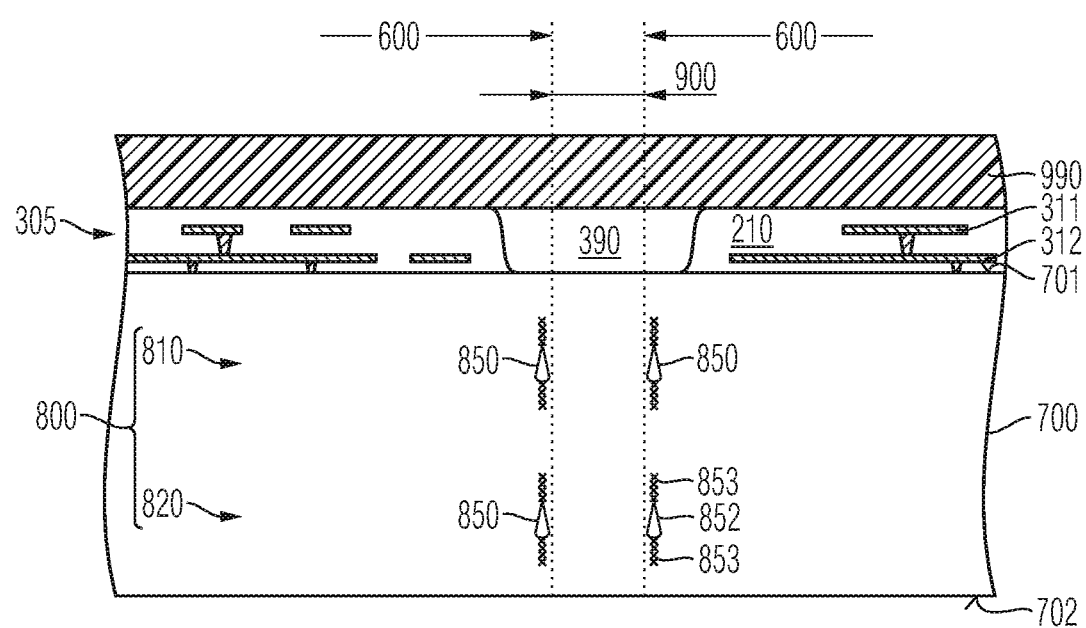
FIG. 5A is a schematic horizontal cross-sectional view of a portion of a semiconductor substrate for illustrating effects of the embodiments, at the beginning of a sawing process using a dicing saw.
Figure 5B:
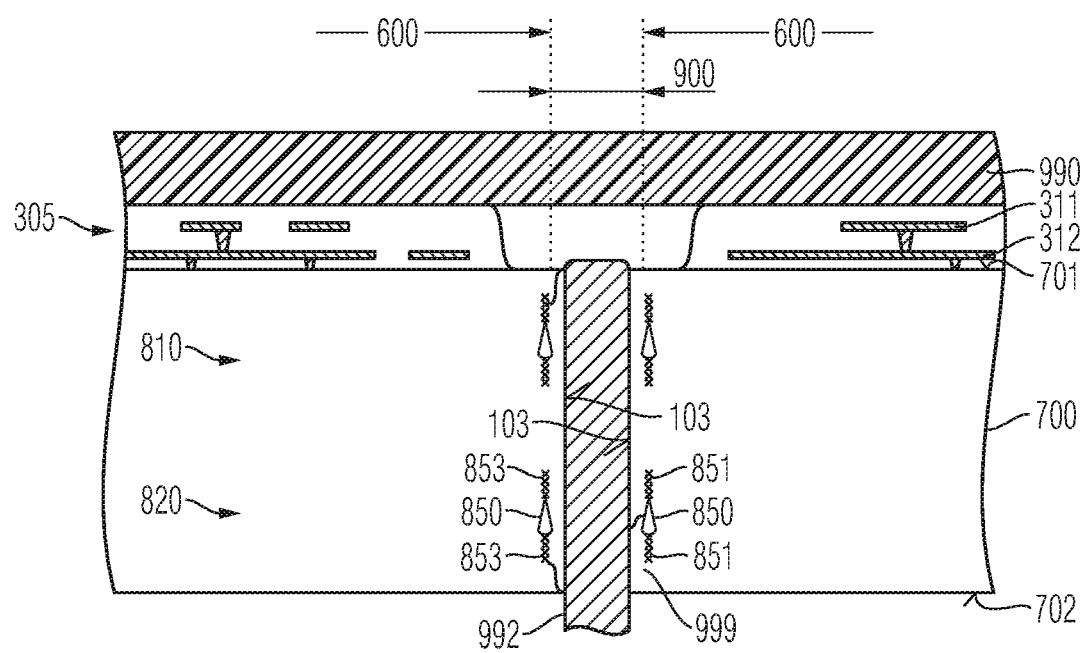
FIG. 5B is a schematic vertical cross-sectional view of the semiconductor substrate portion of FIG. 5A during dicing.

FIGS. 5A and 5B illustrate the effect of the embedded structure 800 as crack-stop structure.

FIG. 5A shows a semiconductor substrate 700 with a front side metallization 305 including several wiring layers 311, 312 and contact vias connecting the wiring layers 311, 312 with each other and with doped regions in device regions 600 of the semiconductor substrate 700. A passivation structure 210, which may include a polyimide layer, may cover the topmost wiring layer 311 completely or may cover at least sidewalls of the front side metallization 305.

The front side metallization 305 and the passivation structure 210 may have a grid-shaped opening 390 where the front side metallization 305 and the passivation structure 210 are absent. The opening 390 may expose at least a portion of a kerf region 900 that separates neighboring device regions 600. For example, an outer edge of the passivation structure 210 may be within a termination region 690 of the device region 600 or within a peripheral portion 612 of an active region 610 of the device region 600.

In a vertical projection of the openings 390, the semiconductor substrate 700 includes circumferential embedded structures 800. In the illustrated embodiment each embedded structure 800 includes two vertically separated substructures 810, 820, wherein each of the substructures 810, 820 includes a polycrystalline structure 850 as well as tensile-stressed portions 853 of the single-crystalline semiconductor substrate 700. A vertical distance between the polycrystalline structures 850 of the two vertically separated substructures 810, 820 is at least 60 µm, e.g., at least 100 µm.

A pick-up tape 990 may be attached to the semiconductor substrate 700 at the front side, e.g., on the passivation structure 210.

FIG. 5B shows the semiconductor substrate 700 during die separation using a dicing saw 992 that removes a portion of the semiconductor substrate 700 within the kerf region 900 and between neighboring circumferential embedded structures 800.

The rotating dicing saw 992 tends to induce cracks 999 that originate along a side surface 103 exposed by the rotating dicing saw 992 and in regions of the main surface 701 and the rear side surface 702 close to the rotating dicing saw 992. Lattice defects such as grain boundaries in the tensile-stressed portions 853 and in the polycrystalline structure 850 stop the propagation of the cracks 999 into central portions of the device regions 600.

Figure 6:
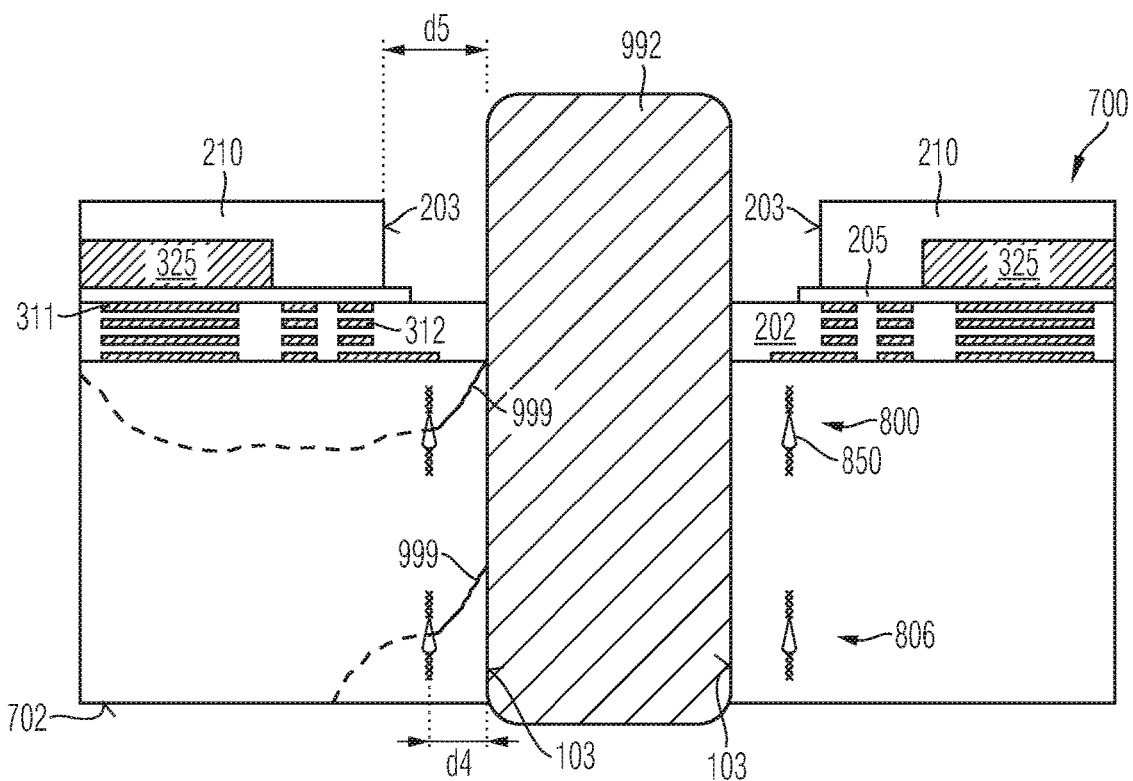
FIG. 6 is a schematic vertical cross-sectional view of a portion of another semiconductor substrate for illustrating effects of the embodiments.

FIG. 6 shows dicing by means of a dicing saw 992 for a semiconductor substrate 700 including a power metallization 325 on a stack of wiring layers 311, 312, wherein dielectric layers 202 separate the wiring layers 311, 312 from each other and from the semiconductor substrate 700 and wherein a dielectric separation layer 205 separates the power metallization 325 form the topmost wiring layer 311.

A distance d4 between a vertical center axis of the polycrystalline structure 850 and a sidewall 203 of a passivation structure 210 that covers at least a sidewall of the power metallization 325 is approximately half the distance d5 between the sidewall 203 of the passivation structure 210 and a perfectly aligned dicing saw 992.

The embedded structures 800 suppress the propagation of cracks 999 generated by the dicing saw 992 along a side surface 103 gradually exposed by the dicing process.

Figure 7A:
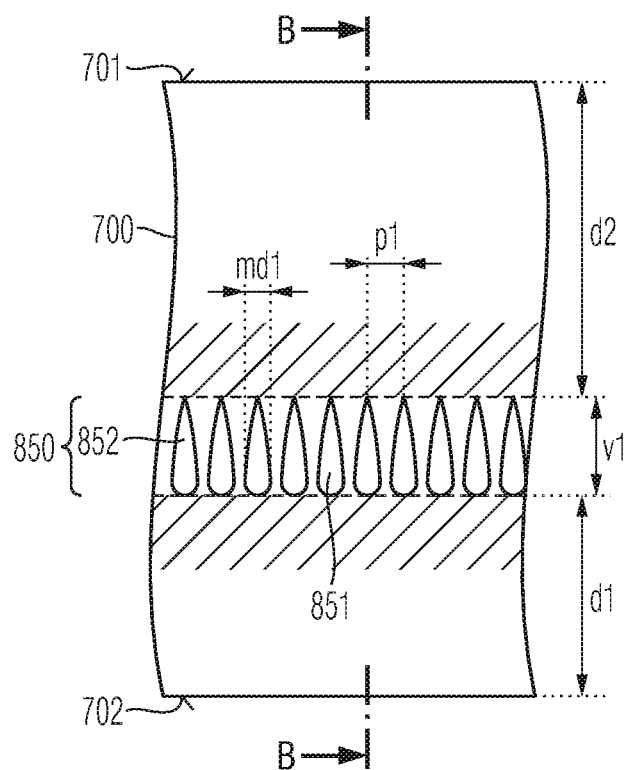
FIG. 7A is a vertical cross-sectional view of a portion of a semiconductor substrate in a plane parallel to a horizontal longitudinal extension of an embedded structure comprising a plurality of separated polycrystalline structures according to an embodiment.
Figure 7B:
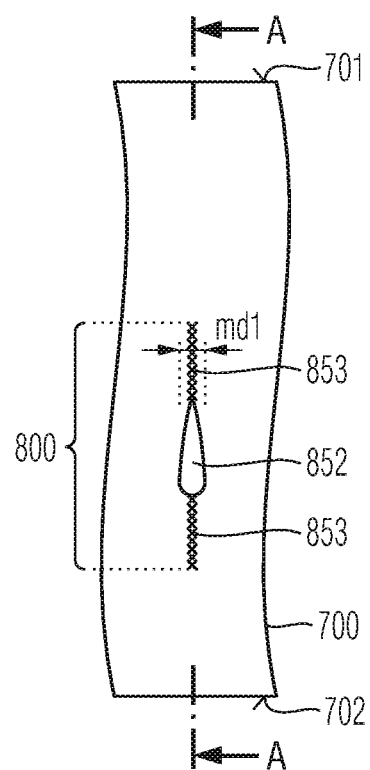
FIG. 7B is a vertical cross-sectional view of the semiconductor substrate portion of FIG. 7A in a plane perpendicular to the horizontal longitudinal extension of the embedded structure.

FIGS. 7A and 7B show details of a single-layered circumferential embedded structure 800 that includes a polycrystalline structure 850 with a plurality of separated polycrystalline columns 852 arranged in rows.

The polycrystalline columns 852 may be approximately rotational symmetric around a vertical center axis, wherein a diameter of the polycrystalline columns 852 may vary along the vertical extension. A mean maximum lateral diameter md1 may be in a range from 1.5 µm to 8 µm, for example, in a range from 2.5 µm to 3.5 µm. A mean lateral center-to-center distance p1 between neighboring polycrystalline columns 852 may be at least 120% of the mean maximum lateral diameter md1. A vertical extension v1 of the polycrystalline columns 852 may be at least four times, e.g., at least five times the mean maximum lateral diameter.

The embedded structure 800 further includes single-crystalline portions 851 of the semiconductor substrate 700 directly between neighboring polycrystalline columns 852 as well as tensile-stressed portions 853 of the semiconductor substrate 700 in the vertical projections of the polycrystalline columns 852 in direction of the main surface 701 and in direction of the rear side surface 702. A tensile stress in the tensile-stressed portions 853 may be at least $-10E8$ dyn/cm$^2$, e.g., at least $-20E8$ dyn/cm$^2$.

A first distance d1 between the polycrystalline structure 850 and the rear side surface 702 may be at least 20 µm, e.g., at least 30 µm. A second distance d2 between the polycrystalline structure 850 and the main surface 701 may be at least 20 µm, e.g., at least 30 µm.

FIGS. 7C and 7D refer to an embedded structure 800 including a continuous polycrystalline structure 850. In a cross-section orthogonal to a lateral longitudinal extension the continuous polycrystalline structure 850 may have a mean maximum lateral width w1 in a range from 1.5 µm to 8 µm, for example, in a range from 2.5 µm to 3.5 µm. The further dimensions may correspond to that mentioned with reference to FIGS. 7A to 7B.

Figure 8A:
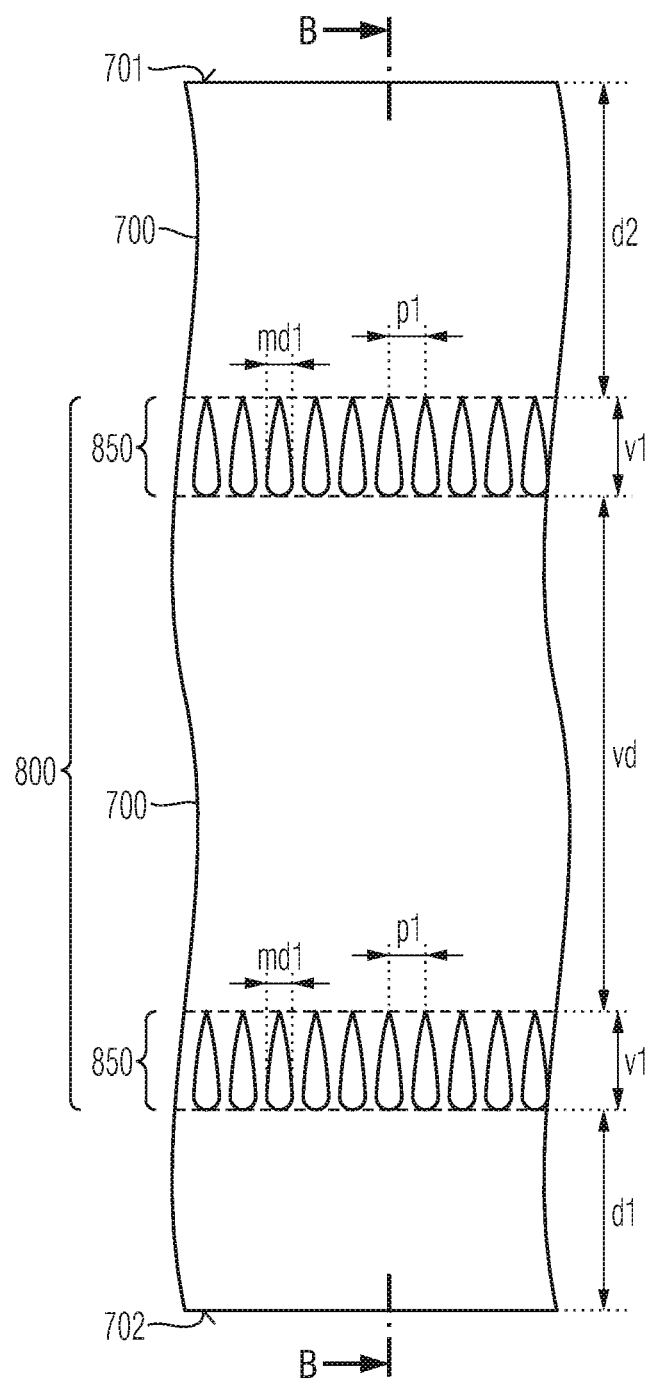
FIG. 8A is a schematic vertical cross-sectional view along a horizontal longitudinal direction of an embedded structure including two vertically separated portions according to a further embodiment.
Figure 8B:
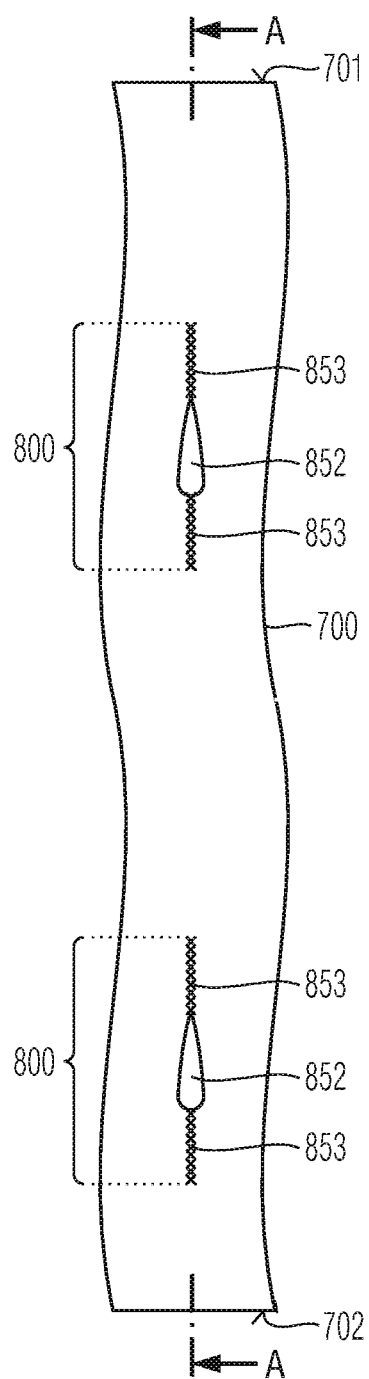
FIG. 8B is a schematic vertical cross-sectional view of the semiconductor substrate portion of FIG. 8A in a plane perpendicular to the horizontal longitudinal extension of the embedded structure.

FIGS. 8A and 8B refer to embodiments with the embedded structure 800 including at least two, e.g., two, three or more vertically separated substructures 810, 820. A minimum distance vd1 between vertically neighboring substructures 810, 820 may be 100 µm. The vertically separated substructures 810, 820 may be vertically aligned or may be laterally displaced against each other, for example, by at least 5 µm. The further dimensions of each of the substructures 810, 820 may correspond to that mentioned with reference to FIGS. 7A to 7D.

Figure 9A:
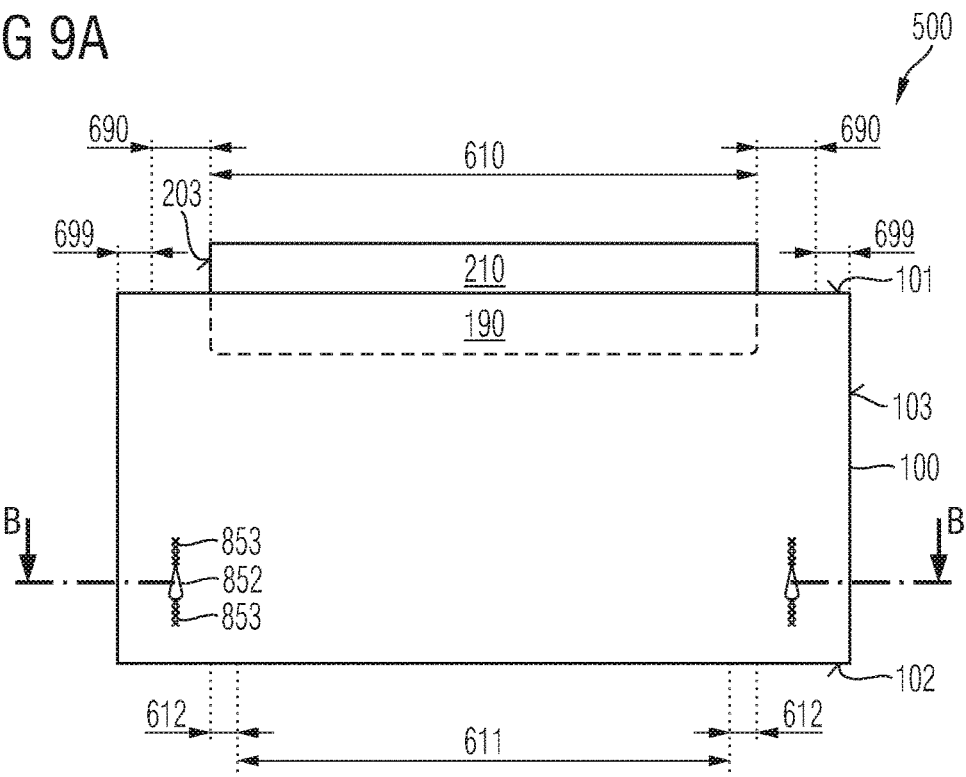
FIG. 9A is a schematic vertical cross-sectional view of a semiconductor device including a circumferential embedded structure formed by laser irradiation according to an embodiment.
Figure 9B:
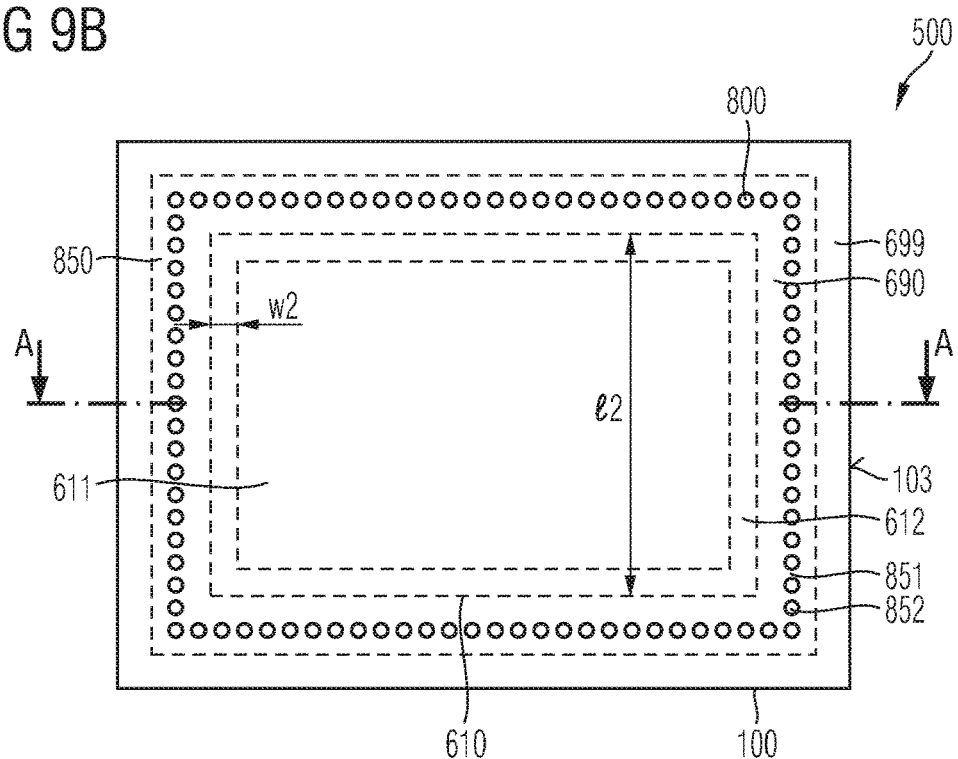
FIG. 9B is a schematic horizontal cross-sectional view of the semiconductor device of FIG. 9A along line B-B.

FIGS. 9A and 9B refer to a semiconductor device 500 which may be obtained by the method as described above. The semiconductor device 500 may be an integrated circuit, a power semiconductor device, a micro electromechanical system, a memory circuit, a controller circuit, or a logic circuit, e.g., a CMOS circuit.

The semiconductor device 500 includes a mainly single-crystalline semiconductor body 100 of a semiconductor material, e.g., of Si, Ge, SiGe, SiC or an $A_{III}B_V$ semiconductor. The semiconductor body 100 has a first surface 101 at a front side and a second surface 102 parallel to the first surface 101 opposite to the first surface 101 on the back. A side surface 103 connects the first and second surfaces 101, 102. A normal to the first surface 101 defines a vertical direction and directions parallel to the first surface 101 are horizontal directions. A horizontal cross-sectional area of the semiconductor body 100 may be approximately rectangular.

A central active region 610 of the semiconductor body 100 includes all functional elements 190 that define the target functionality of the semiconductor device 500. The functional elements 190 may be formed along the first surface 101. According to an embodiment at least some of the functional elements 190 may extend to the second surface 102. The functional elements 190 may include active electronic elements with non-linear characteristic such as pn diodes, Schottky diodes, bipolar transistors, field effect transistors, junction transistors, and memory cells and/or passive electronic elements such as resistors and capacitors as well as micro-electromechanical structures.

A passivation structure 210 that may at least partly cover metal structures may be formed at the front side in at least the active region 610.

A circumferential embedded structure 800 includes a polycrystalline structure 850 of the semiconductor material of the single-crystalline semiconductor body 100. The embedded structure 800 surrounds at least a central portion 611 of the active region 610, wherein the central portion 611 includes at least 90%, e.g., 95% of the total active region 610.

According to an embodiment the polycrystalline structure 850 is in a peripheral portion 612 of the active region 610 and surrounds the central portion 611, wherein a width w2 of the peripheral portion 612 may be at most 5%, e.g., at most 2% of the smaller edge length l2 of the active region 610, by way of example.

According to another embodiment the polycrystalline structure 850 is in a termination region 690 that surrounds the active region 610 and that is devoid of functional elements 190, wherein the termination region 690 may include an edge construction, e.g., a seal ring, a guard ring or a circumferential dielectric structure extending from the first surface 101 into the semiconductor body 100.

According to a further embodiment the polycrystalline structure 850 is in an idle region 699 that may surround the termination region 690 and that may be formed from remnants of a kerf region.

For example, the polycrystalline structure 850 is formed between a sidewall 203 of the passivation structure 210 and the side surface 103.

With regard to the details of the embedded structure 800, reference is made to the detailed description above.

Figure 10:
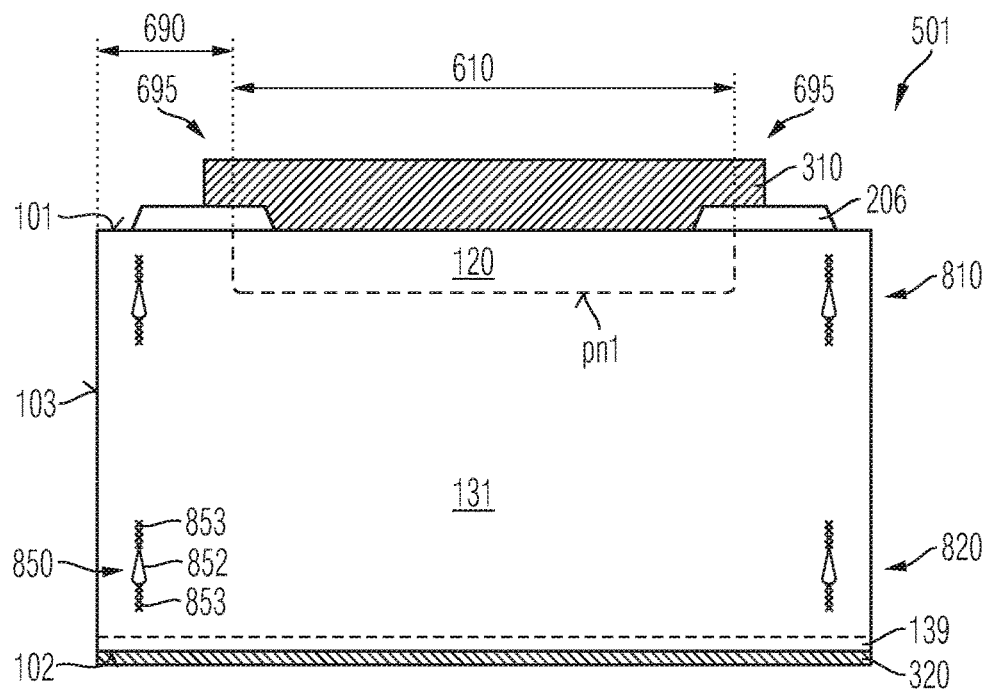
FIG. 10 is a schematic vertical cross-sectional view of a semiconductor diode including a circumferential embedded structure formed by laser irradiation according to an embodiment.

FIG. 10 refers to a power semiconductor diode 501 with a forward current flow from a first surface 101 to a second surface 102 of a semiconductor body 100 or vice versa. A metallic first load electrode 310 directly adjoins to a portion of the first surface 101 and a metallic second load electrode 320 directly adjoins to the second surface 102.

The semiconductor body 100 may include a doped anode/body region 120 and a lightly doped drift zone 131 forming a first pn junction pn1 with the anode/body region 120. The anode/body region 120 forms a low-ohmic contact with the first load electrode 310. A heavily doped contact portion 139 may form a unipolar junction with the drift zone 131 and a low-ohmic contact with the second load electrode 320. A dielectric structure 206 may separate the first load electrode 310 from portions of the drift zone 131 to form an edge construction 695 including a field plate. A lateral extension of the anode/body region 120 defines an active region 610 of the semiconductor diode 501.

A circumferential embedded structure 800 as described above, e.g., an embedded structure 800 with two vertically separated substructures 810, 820 as described with reference to FIGS. 8A and 8B surrounds the active region 610. The embedded structure 800 may be effective as crack-stop during a mechanical dicing, as a region with increased density of gettering sites for impurity atoms, and as a region with increased recombination rate for mobile charge carriers, wherein the increased recombination rate improves removal of mobile charge carriers from the termination region 690 in case of a polarity change across the first and second load electrodes 310, 320.

Figure 11:
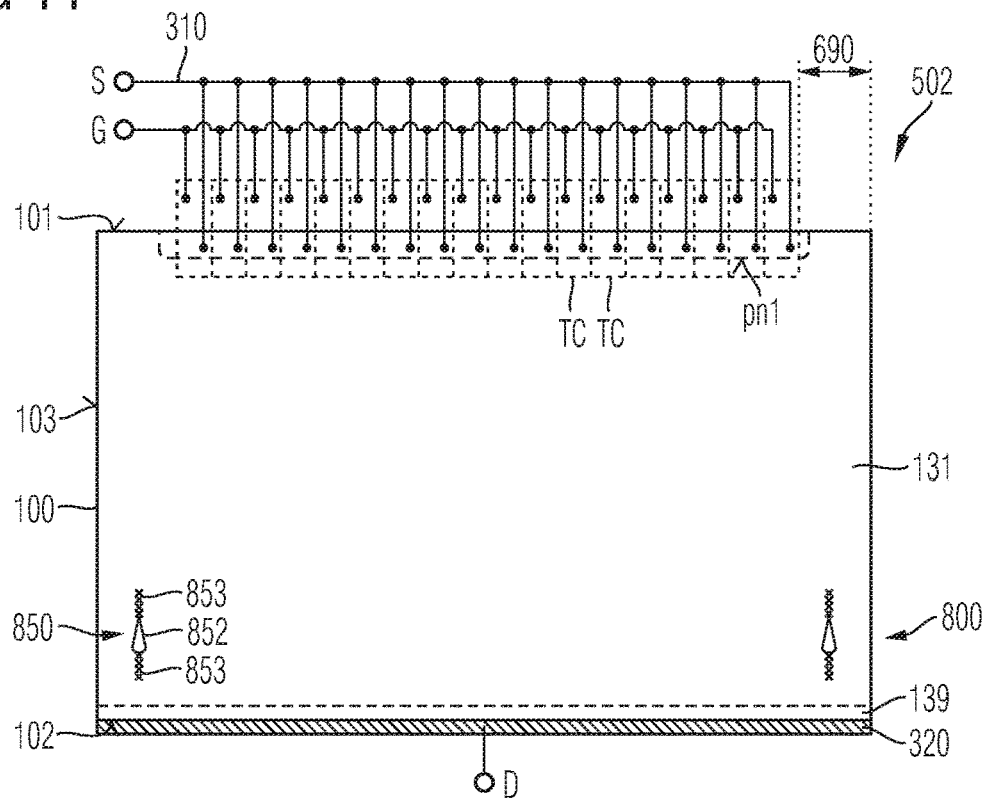
FIG. 11 is a schematic vertical cross-sectional view of a power IGFET (insulated gate field effect transistor) including a circumferential embedded structure formed by laser irradiation according to another embodiment.

FIG. 11 shows an IGFET 502 with a plurality of transistor cells TC electrically connected in parallel. The common anode/body region 120 forms a first pn junction pn1 with the drift zone 131. The first load electrode 310 may form or may be electrically connected to a source terminal S. The second load electrode 320 may form or may be electrically connected to a drain terminal D. The embedded structure 800 may be effective as crack-stop and may locally increase the recombination rate in a termination region to accelerate removal of mobile charge carriers from the termination region in case the polarity of a voltage across a body diode formed by the first pn junction pn1 changes from forward bias to reverse bias.

Figure 12:
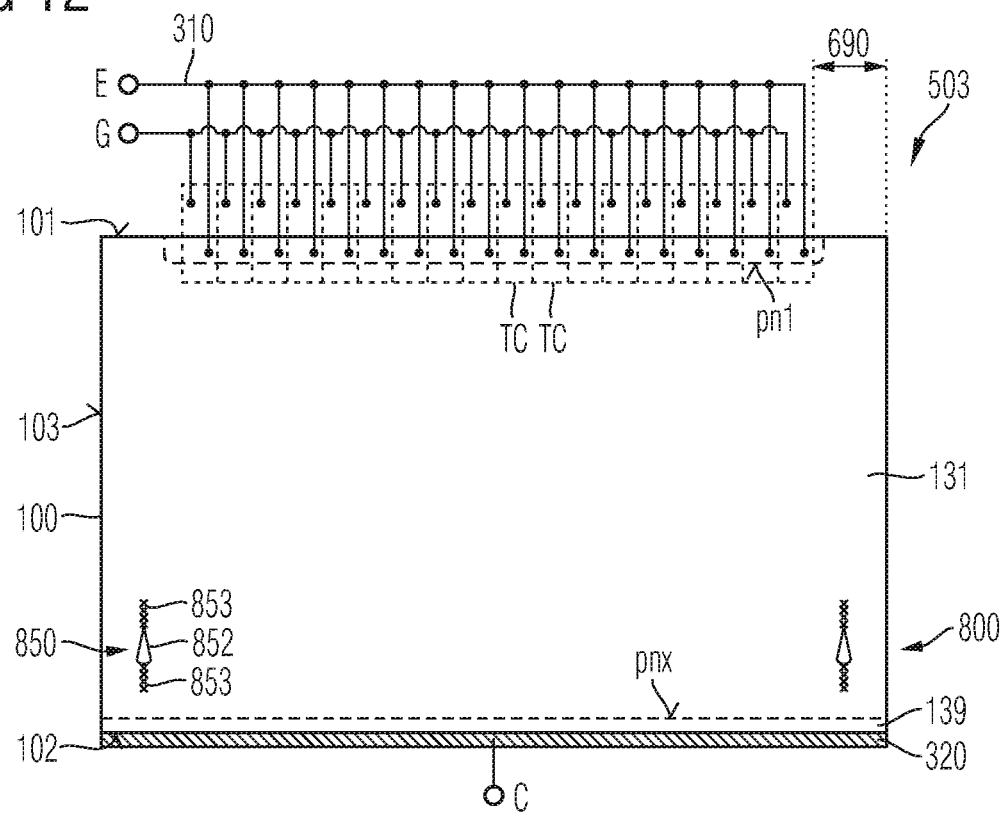
FIG. 12 is a schematic vertical cross-sectional view of an IGBT (insulated gate bipolar transistor) including a circumferential embedded structure formed by laser irradiation according to a further embodiment.

In the IGBT 503 of FIG. 12 the contact portion 139 forms a further pn junction px with the drift zone 131 or with a buffer zone of the conductivity type of the drift zone 131, wherein the buffer zone is directly between (sandwiched between) the drift zone 131 and the contact portion 139. The first load electrode 310 may form or may be electrically connected to an emitter terminal E. The second load electrode 320 may form or may be electrically connected to a cathode terminal C. The embedded structure 800 may be effective as crack-stop and as a region with increased recombination rate for mobile charge carriers, wherein the increased recombination rate may improve removal of mobile charge carriers from the termination region 690 in case of a change from the on-state to the off-state.

Figure 13:
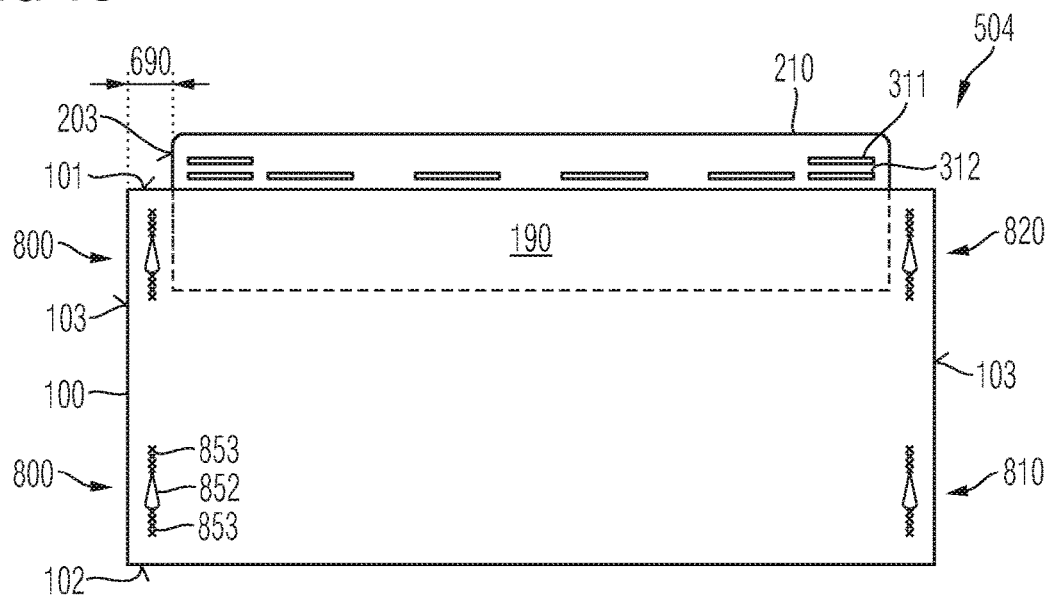
FIG. 13 is a schematic vertical cross-sectional view of an integrated circuit including a circumferential embedded structure formed by laser irradiation according to another embodiment.

The integrated circuit 504 of FIG. 13 may be a controller, a memory device, a logic circuit, e.g., a CMOS device and includes one or more wiring layers 311, 312 at a front side. A passivation structure 210 covers at least portions of the wiring layers 311, 312. A sidewall 203 of the passivation structure 210 is formed at a distance to a side surface 103 of the semiconductor body 100. Functional elements 190 of the integrated circuit 504 are formed within the vertical projection of the passivation structure 210.

An embedded structure 800 as described above may be formed between the side surface 103 and the vertical projection of the sidewall 203 of the passivation structure 210 and may be effective as crack-stop during a mechanical dicing and as a region with increased density of gettering sites for impurity atoms.

Figure 14:
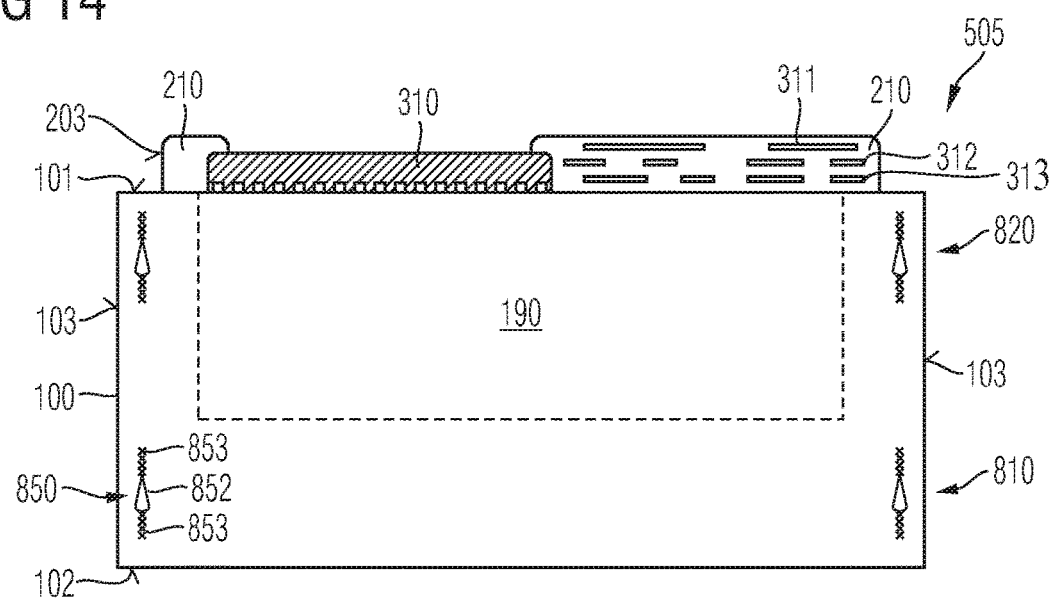
FIG. 14 is a schematic vertical cross-sectional view of a power semiconductor device including logic circuits and a circumferential embedded structure formed by laser irradiation according to a further embodiment.

The integrated circuit 505 of FIG. 14 combines a power semiconductor portion, e.g., an IGFET accessible through a first load electrode 310 with a logic portion with interconnections in one or more wiring layers 311, 312, 313. A passivation structure 210 may cover the wiring layers 311, 312, 313 and sidewalls of the first load electrode 310. An embedded structure 850 may be formed between a side surface 103 of the semiconductor body 100 and a sidewall 203 of the passivation structure 210.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   forming, by laser irradiation, an embedded structure in a semiconductor substrate of a semiconductor material, the embedded structure comprising a polycrystalline structure of the semiconductor material and surrounding a central portion of a semiconductor die; and
   separating, using a dicing saw, the semiconductor die comprising the embedded structure from the semiconductor substrate, the embedded structure forming a crack-stop and/or gettering structure permanently embedded in the semiconductor die.

2. The method of claim 1, further comprising:
   forming functional elements of the semiconductor device in an active region of the semiconductor die.

3. The method of claim 2, wherein the embedded structure is formed outside of the active region.

4. The method of claim 2, wherein the embedded structure is formed in a termination region of the semiconductor die, and wherein the termination region surrounds the active region and comprises an edge construction.

5. The method of claim 2, wherein the embedded structure is formed in an idle region of the semiconductor die, and wherein the idle region is outside of both a device region comprising the active region and a termination region that surrounds the active region and that comprises an edge construction.

6. The method of claim 1, wherein a wavelength of a laser beam for performing the laser irradiation is at least 1000 nm.

7. The method of claim 1, wherein the laser irradiation includes pulsed irradiation.

8. The method of claim 1, wherein separating the semiconductor die comprises dicing the semiconductor substrate at a lateral distance to the embedded structure.

9. The method of claim 1, wherein a first focal distance between a focal plane of a laser beam for performing the laser irradiation in the semiconductor substrate and a rear side surface of the semiconductor substrate is at least 20 μm.

10. The method of claim 1, wherein forming the embedded structure comprises forming, by the laser irradiation, a plurality of laterally separated polycrystalline columns, and wherein the embedded structure comprises the plurality of laterally separated polycrystalline columns and single-crystalline portions of the semiconductor substrate between neighboring polycrystalline columns.

11. The method of claim 10, wherein each polycrystalline column is formed with a mean maximum lateral diameter in a range from 1.5 µm to 10 µm and a mean lateral center-to-center distance of at least 120% of the mean maximum lateral diameter.

12. The method of claim 1, wherein forming the embedded structure comprises forming, by the laser irradiation, a continuous circumferential polycrystalline structure.

13. The method of claim 1, wherein forming the embedded structure comprises forming at least two vertically separated substructures, and wherein a vertical distance between neighboring ones of the at least two vertically separated substructures is at least 60 µm.

14. The method of claim 1, wherein the semiconductor substrate comprises single-crystalline silicon.

15. The method of claim 1, wherein a vertical extension of the polycrystalline structure is at least 5 times a mean maximum lateral width.

16. The method of claim 1, wherein forming the embedded structure comprises forming, by the laser irradiation, a plurality of laterally separated circumferential embedded structures.

17. The method of claim 1, wherein forming the embedded structure comprises forming, by the laser irradiation, the polycrystalline structure of the semiconductor material and a tensile-stressed single-crystalline portion of the semiconductor material in a vertical projection of the polycrystalline structure.

18. The method of claim 1, wherein forming the embedded structure comprises forming at least two vertically separated substructures, each of the embedded substructures comprising a polycrystalline structure and a tensile-stressed single-crystalline portion of the semiconductor material.

19. The method of claim 10, wherein the embedded structure further comprises tensile-stressed single-crystalline portions of the semiconductor material in vertical projections of the laterally separated polycrystalline columns.

20. The method of claim 1, wherein forming the embedded structure comprises forming, by the laser irradiation, a plurality of rows of laterally separated substructures, wherein the laterally separated substructures in each row comprise polycrystalline structures of the semiconductor material laterally separated from one another by single-crystalline portions of the semiconductor material, and wherein the rows of laterally separated substructures are vertically separated from one another by single-crystalline portions of the semiconductor material.

* * * * *